(12) United States Patent
Ning

(10) Patent No.: US 6,323,067 B1
(45) Date of Patent: *Nov. 27, 2001

(54) LIGHT ABSORPTION LAYER FOR LASER BLOWN FUSES

(75) Inventor: X. J. Ning, Mohegan Lake, NY (US)

(73) Assignee: Infineon Technologies North America Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/238,543

(22) Filed: Jan. 28, 1999

(51) Int. Cl.$^7$ ..................................................... H01L 21/82
(52) U.S. Cl. ............................................................ 438/132
(58) Field of Search ..................... 345/76, 204; 438/132, 438/128; 357/51; 483/623, 108; 156/281; 372/45

(56) References Cited

U.S. PATENT DOCUMENTS

| | | | |
|---|---|---|---|
| 4,853,758 | * 8/1989 | Fisher | 357/51 |
| 5,689,428 | * 11/1997 | Sauerbrey | 702/60 |
| 5,702,565 | * 12/1997 | Wu | 264/400 |
| 5,756,147 | * 5/1998 | Wu | 427/66 |
| 5,841,802 | * 11/1998 | Whiteley | 372/45 |
| 5,877,735 | * 3/1999 | King | 345/76 |
| 6,057,180 | * 5/2000 | Sun | 438/132 |

\* cited by examiner

Primary Examiner—John F. Niebling
Assistant Examiner—Andre' Stevenson
(74) Attorney, Agent, or Firm—Stanton Braden

(57) ABSTRACT

A light absorption layer deposited onto a dielectric layer having an interconnect positioned below converts light into heat during laser deleting of the interconnect. This approach allows for minimum reflectance of the laser when contacting the light absorption layer with the light from the laser thereby melting the interconnect more efficiently. The light absorption layer also functions as (1) a buried anti-reflective layer for via opening lithography which connects the interconnect and a metal level position above and (2) an etch stopper when forming a fuse opening by RIE.

10 Claims, 4 Drawing Sheets

LIGHT ABSORPTION LAYER FOR LASER BLOWN FUSES

BACKGROUND

1. Technical Field

This disclosure relates generally to integrated circuits that include a plurality of fuses wherein at least one of the fuses is intentionally blown by, for example, application of laser energy. More particularly, a fuse in the integrated circuits described herein having a dielectric layer formed thereon can be blown more efficiently during laser deleting by adding a light absorption layer onto the dielectric layer. Methods for producing such integrated circuits are also described.

2. Background of Related Art

Integrated circuits consist of many, sometimes millions, of individual elements joined together on a chip by electrically conductive interconnects. Typically, the interconnects are formed into stacked interconnected levels of a densely packed semiconductor device which create multi-level or multi-layered schemes known as dual damnascene structures as generally depicted in FIG. 1. Methods for manufacturing a dual damascene structure are known. See, e.g., U.S. Pat. Nos. 5,529,953, 5,602,423 and 5,614,765. Generally, when fabricating integrated circuits with a dual damascene structure, an insulating or dielectric material such as silicon oxide of a semiconductor device will be patterned with several thousand openings to create conductive line openings and via openings. The conductive line and via openings can then be filled with a conductive metal layer, e.g., aluminum, to interconnect the active and/or passive elements of the integrated circuit. The dual damascene structure can also be used for forming multilevel conductive lines of metal, e.g., copper, in insulating layers, e.g., polyimide, of multi-layer substrates on which semiconductor devices can be mounted.

It has been found that the ability to alter interconnects on a chip after standard processing is completed provides great improvement in a chip yield (number of working chips) and chip customization (modifying a chip to perform a specific function). A technique widely practiced in the industry involves using light from a laser to vaporize (blow) segments of interconnects (referred to as fuses), thereby forming an "open" that eliminates the electrical connection originally provided by the interconnect. Usually, these fuses are connected to redundancy circuits, replacing defect word- and/or bit-lines with redundant lines (redundancy activation).

Although this technique of laser deleting has been widely used in an attempt to improve functional yields, fuse flow yields and fuse reliability have been problematic in devices made where a fuse such as, for example, an aluminum fuse, is positioned under a dielectric layer, e.g., TEOS. Specifically, when the application of laser energy to the fuse having the dielectric layer formed thereon, the light from the laser is reflected from the device instead of being absorbed and subsequently converted into heat. Therefore, the fuse is not melted and the laser cannot blow the fuse thereby lowering the efficiency of the fuse blow.

It would be desirable to provide a light absorption layer on top of a dielectric layer covering a fuse to allow light from laser energy to be converted into heat thereby blowing the fuse.

SUMMARY OF THE INVENTION

It has now been discovered that a fuse formed on an integrated circuit device can be blown by forming a layer of dielectric material on the fuse and a light absorption layer onto the layer of dielectric material.

A process for making an improved integrated circuit has also been discovered. In the process, a layer of dielectric material is formed over the fuse. Then, a light absorption layer is formed over the dielectric layer. In a particularly useful embodiment, a second dielectric layer is formed on the light absorption layer. Further processing of the device can then be performed.

The devices and methods described herein allow for laser fuse blow to be achieved more efficiently by forming a light absorption layer onto a dielectric layer formed on a fuse.

DESCRIPTION OF THE PREFERRED EMBODIMENTS

An integrated circuit device in accordance with this disclosure includes at least one interconnect, i.e., fuse, formed on a substrate, a dielectric layer formed over at least a portion of the interconnect with a light absorption layer formed thereon. The light absorption layer substantially reduces the reflection of a light from a laser and instead converts the light to heat thereby melting the interconnect when the interconnect is exposed to laser energy.

Figure 1:
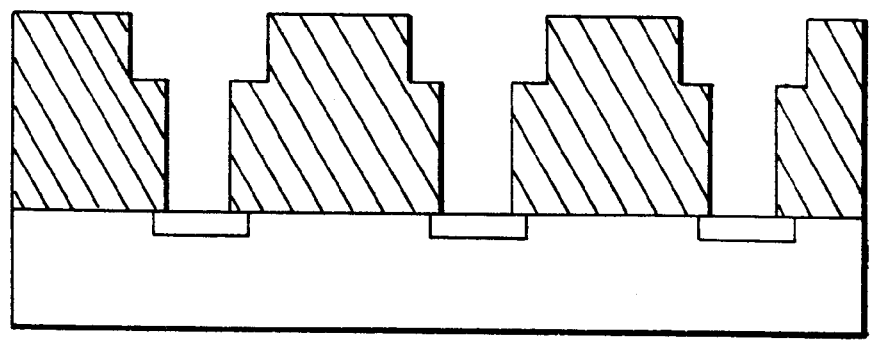
FIG. 1 is a schematic, cross-sectional view of a dual damascene device in accordance with the prior art.
Figure 2:
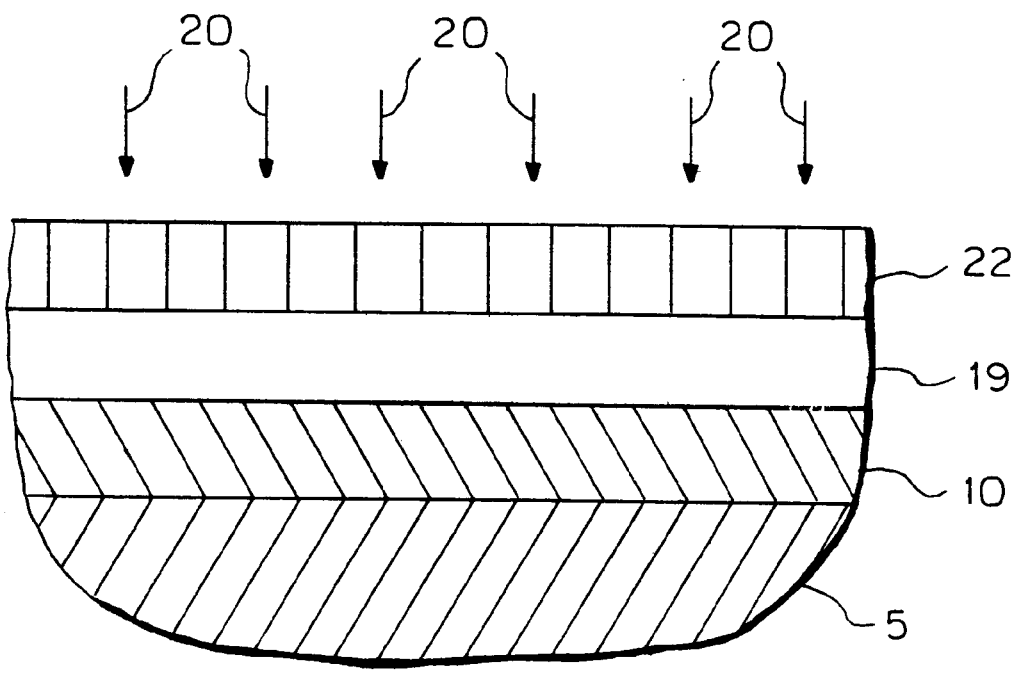
FIG. 2 is a schematic, cross-sectional view of a device in accordance with this disclosure.

Referring to FIG. 2, at least one interconnect such as, for example, fuse 10, is formed on substrate 5. Suitable materials for forming fuse 10 include aluminum, copper, polysilicon, silicide, Al—Si, Al—Cu, Al—Si—Cu or any high conductive metal or alloy. Techniques for depositing a fuse from these materials are within the purview of one skilled in the art. Fuse 10 should be as thin as possible, e.g., a thickness ranging from about 0.1 $\mu$m to about 1 $\mu$m and preferably from about 0.2 $\mu$m to about 0.5 $\mu$m. The dimensions of the fuse will typically be in the range of from about 0.2 μm to about 5 μm wide and from about 5 μm to about 15 μm long. Preferably, when the fuse is formed in parallel juxtaposition with another fuse the distance between the fuses (fuse pitch) ranges from about 0.4 μm to about 3 μm.

A dielectric layer 19 is then formed on the surface of fuse 10. The dielectric material used herein can include any suitable dielectric material known to those skilled in the art. Preferred dielectric materials include TEOS, silicon oxide or silicon nitride with TEOS being more preferred. The dielectric layer 19 advantageously serves as a buffer layer underneath the light absorption layer which is discussed hereinbelow.

The dielectric layer 19 can ordinarily be formed on the surface of fuse 10 as a substantially planarized layer. A substantially planarized layer can be achieved either directly through the formation process or by applying known and conventional procedures, e.g., chemical-mechanical polishing (CMP) once the dielectric layer 19 has been formed. Techniques for forming dielectric layer 19 are within the purview of one skilled in the art, e.g., by PE chemical vapor deposition (CVD). Generally, the thickness of dielectric layer 19 will range from about 25 nm to about 500 nm and preferably from about 50 nm to about 300 nm.

Once the dielectric layer 19 has been formed on the surface of fuse 10, light absorption layer 22 is then deposited thereon. Light absorption layer 22 absorbs and converts light into heat when the light from laser 20 impinges thereon, thereby melting the fuse 10, i.e., blowing the fuse to form an opening that eliminates the electrical connection originally provided by the fuse, positioned below light absorption layer 22 and dielectric layer 19. Thus, the absorption layer 22 should allow for a minimum reflectance at a given laser wavelength. Light absorption layer 22 also can control the thickness of the first dielectric layer 19 by acting as an etch stopper when further processing the device, which is described hereinbelow. Materials that are highly absorptive of laser energy are particularly useful. Suitable materials include materials such as, for example, $SiO_xN_y$ wherein x is from about 0.2 to about 1.9 and y is from about 0.05 to about 0.5, diamond like carbon (DLC), amorphous SiC, and silicon nitride with $SiO_xN_y$ being preferred. The light absorption layer 22 can be formed using techniques known to those skilled in the art, e.g., by PECVD.

The precise dimensions of the light absorption layer 22 will depend on a number of factors including, but not limited to, the dimensions and material of construction of the fuse being blown and the type and energy of the laser being used, i.e., the wavelength of the laser such as, for example, a wavelength ranging from about 500 to about 2500 nm and preferably from about 1000 to about 1500 nm, to blow the fuses. Generally, the absorption layer 22 will range in thickness from about 20 nm to about 110 nm, preferably from about 30 nm to about 100 nm and more preferably from about 40 nm to about 90 nm.

The thickness of the absorption layer 22 used is also dependent upon by the refractive index (n) and extinction coefficient (k). In general, the refractive index (n) will describe the phase shift of the light as laser 20 passes through each layer while the extinction coefficient (k) is related to the absorbance of the material. Typically, the higher the extinction coefficient (k) value the more absorbent the light absorption layer 22 will be to the light. Thus, for a given wavelength of laser 20, the right combination of the thickness of layer 22, refractive index (n) and extinction coefficient (k) values have to be optimized so that the reflectance of the light from laser 20 will be at a minimum. This can be determined either experimentally or by simulation employing computer programs such as Prolith II.

Figure 3:
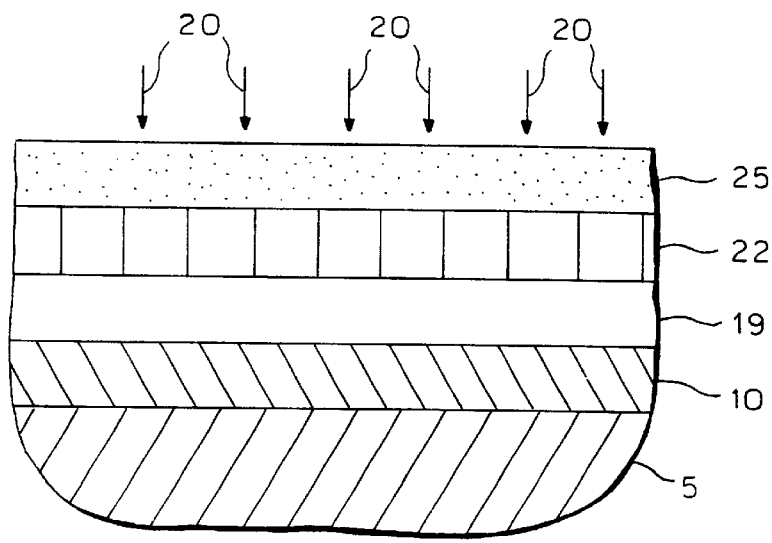
FIG. 3 is a schematic, cross-sectional view of a particularly useful device in accordance with this disclosure.

In a particularly useful embodiment shown in FIG. 3, a second dielectric layer 25 is deposited over light absorption layer 22. Useful dielectric materials include any suitable dielectric materials known to those skilled in the art. Preferred dielectric materials include TEOS, silicon oxide or silicon nitride. The dielectric layer 25 can be deposited using techniques known to those skilled in the art such as, for example, PECVD. The thickness of dielectric layer 25 will ordinarily range from about 100 nm to about 800 nm and preferably from about 200 nm to about 400 nm.

Figure 4:
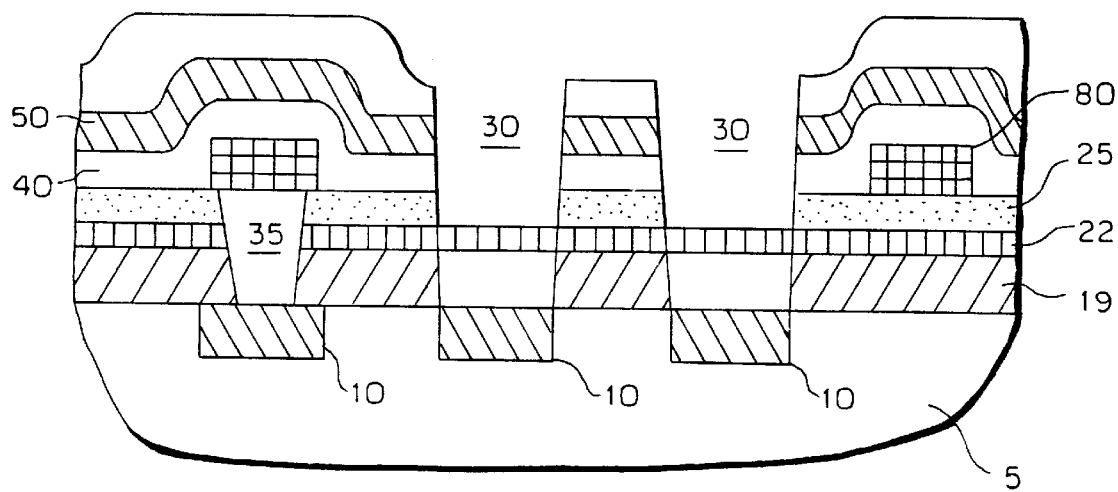
FIG. 4 is a schematic, cross-sectional view of the device following further processing in accordance with this disclosure.

Once the second dielectric layer 25 has been formed, further processing of the integrated circuit device can be performed, either prior to or following applying the laser energy to blow the fuses, to form, for example, a dual damascene structure as depicted in FIG. 4. In general, such processing includes, for example, forming at least one via opening 35. Via opening 35 can be created by first exposing the device to lithography to pattern via holes. When performing lithography on the device, light absorption layer 22 functions as a buried anti-reflection layer to greatly reduce the non-uniformity of reflections across the device that arise from the layers underneath it, e.g., layer 19, thereby reducing the variation of critical dimension (CD) caused by high reflection variations. Following lithograph exposure and developing, the patterned via holes can be subjected to, for example, a wet or dry etching process or a reactive ion etching (RIE) within layers 19, 22 and 25 and above fuse 10 to create via opening 35. The parameters for creating via opening 35 (e.g., type of etchant, concentration of etchant, time, temperature, etc.) are within the purview of one skilled in the art. Suitable etchants include BHF, CDE, $CHF_3$, CO, $N_2$ and oxygen. A conductive material (not shown) can be deposited within and filling via opening 35 by any known or conventional procedure, e.g., selective chemical vapor depositions (CVD's). Any conventional conductive material can be used herein. Suitable materials for forming the conductive material include but are not limited to Ti, TiN, W, Al, Cu, Pd and the like with W and Al being more preferred.

Following the formation of via opening 35, other metal layers, e.g., layer 80, can be deposited onto the device as the upper most metal layer. The upper most metal layer will typically have a thickness greater than that of the fuse 10. Thus, the combination of layers 19, 22 and 25 can be used as an inter metal dielectric (IMD) layer, i.e., the layer between the upper most metal layer and the fuse 10, which is typically the case. Techniques for forming the metal layer 80 are within the purview of one skilled in the art. Additional layers such as 40 and 50 can also be formed over the upper most metal layer. Such layers can be formed from materials such as, e.g., oxides, nitrides, polyimides and the like.

Next, fuse opening 30 can be created to allow for the laser energy, i.e., laser 20, to blow the fuse. In general, fuse opening 30 can be created by, for example, reactive ion etching (RIE). The parameters for creating fuse opening 30

(e.g., type of etchant, concentration of etchant, time, temperature, etc.) are within the purview of one skilled in the art. To create fuse opening 30, the light absorption layer 22 can act as an etch stop when etching the layers 40, 50 etc. Thus, when etching to create fuse opening 30, light absorption layer 22 will advantageously provide signals to stop the etching upon reaching layer 22. Laser energy can then be applied in the fuse opening 30 to blow fuse 10 with layer 22 substantially reducing the reflectance of the light, i.e., being able to absorb the light from the laser and convert it into heat.

The following examples are illustrative of the integrated circuit and method of this invention.

EXAMPLE 1

An integrated circuit was made by first forming a damascene-patterned aluminum fuse. The fuse had a width of 3 µm, a length of 10 µm and a thickness of 350 nm. A layer of dielectric material having a thickness of 50 nm was formed over the aluminum fuse. The dielectric material used to form the layer was TEOS. A light absorption layer made from the material SiOxNy was then formed on the dielectric layer. The light absorption layer had a refractive index (n) of 2.22 and an extinction coefficient (k) of 0.648. In attempting to illustrate which thickness of the light absorption layer would provide the lowest reflectance when applying a laser to the integrated circuit, different thicknesses of the light absorption layer were tested while exposing the integrated circuit to a laser having a wavelength of 1300 nm.

Figure 5:
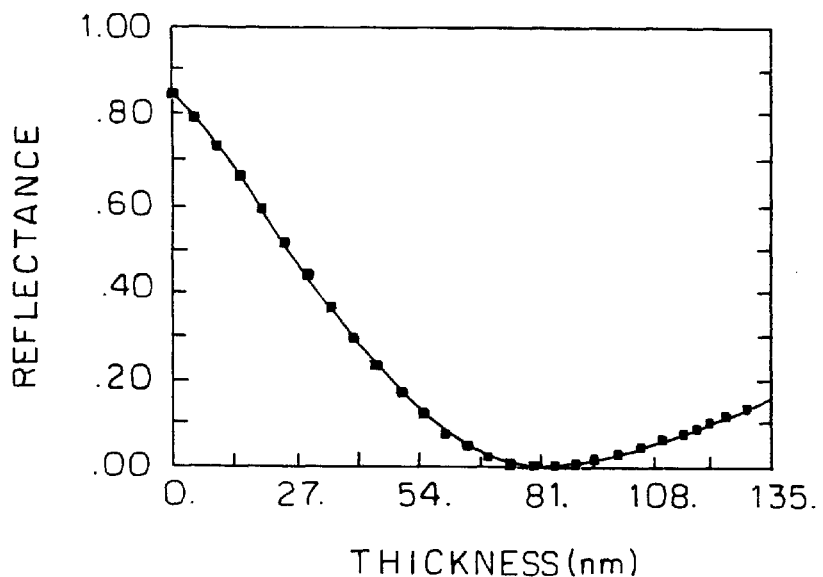
FIG. 5 is a graph comparing reflectance as a function of the thickness of the light absorption layer when the dielectric layer is formed at a thickness of 50 nm.

As shown on the graph of FIG. 5 where the horizontal axis represents the different thicknesses of the light absorption layers tested and the vertical axis represents the reflectance of the light when exposing the light absorption layer to a laser, the reflectance decreased as the thickness increased. Specifically, the reflectance decrease to a low of about 0.01 when the thickness of the light absorption laser was between about 75 nm to about 85 nm. In this range, the light absorption layer absorbed substantially all of the light from the laser. Thicknesses above this range showed an increase in the reflectance as the thickness was further increased.

EXAMPLE 2

An integrated circuit was made by first forming a damascene-patterned aluminum fuse. The fuse had a width of 3 µm, a length of 10 µm and a thickness of 350 nm. A dielectric layer made from the material TEOS was formed over the aluminum fuse. The dielectric layer had a thickness of 100 nm. A light absorption layer made from the material SiOxNy was then formed on the dielectric layer. The light absorption layer had a refractive index (n) of 2.22 and an extinction coefficient (k) of 0.648. In attempting to decide which thickness of the light absorption layer would provide the lowest reflectance when applying a laser to the integrated circuit, different thicknesses of the light absorption layer were tested while exposing the absorption layer to a laser having a wavelength of 1300 nm.

Figure 6:
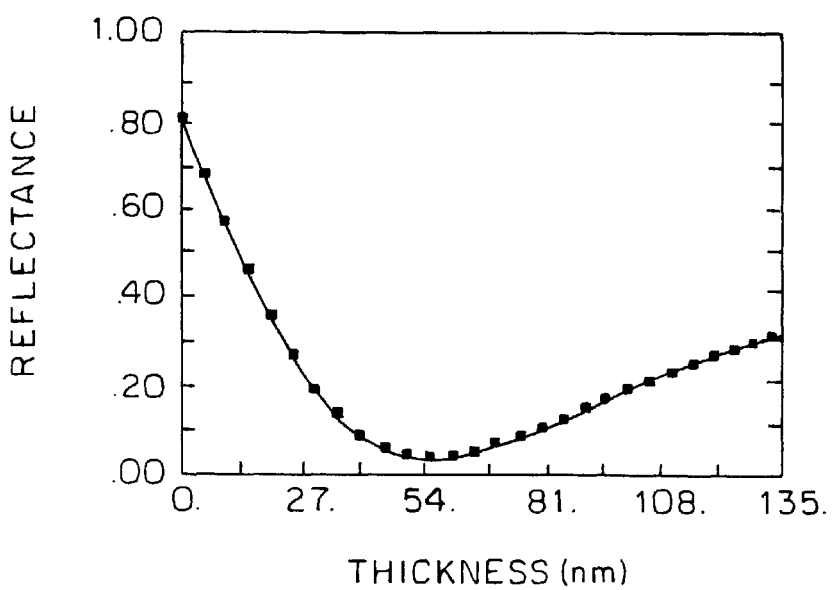
FIG. 6 is a graph comparing reflectance as a function of the thickness of the light absorption layer when the dielectric layer is formed at a thickness of 100 nm.

As shown in the graph of FIG. 6 where the horizontal axis represents the different thicknesses of the light absorption layers tested and the vertical axis represents the reflectance of the light when exposing the light absorption layer to a laser, the reflectance decreased as the thickness of the absorption layer increased. Specifically, the reflectance decreased to about 0.05 when the thickness of the light absorption layer reached about 54 nm. At this thickness, the light absorption layer absorbed substantially all of the light from the laser. The reflectance then began to increase as the thickness of the absorption layer further increased.

EXAMPLE 3

This example illustrates an integrated circuit having no dielectric layer formed on a damascene-patterned aluminum fuse.

An integrated circuit was made by first forming a damascene-patterned aluminum fuse. The fuse had a width of 3 µm, a length of 10 µm and a thickness of 350 nm. A light absorption layer made from the material SiOxNy was formed on the aluminum fuse. The light absorption layer had a refractive index (n) of 2.22 and an extinction coefficient (k) of 0.648. The wavelength of the laser used in testing the light absorption layer was 1300 nm.

Figure 7:
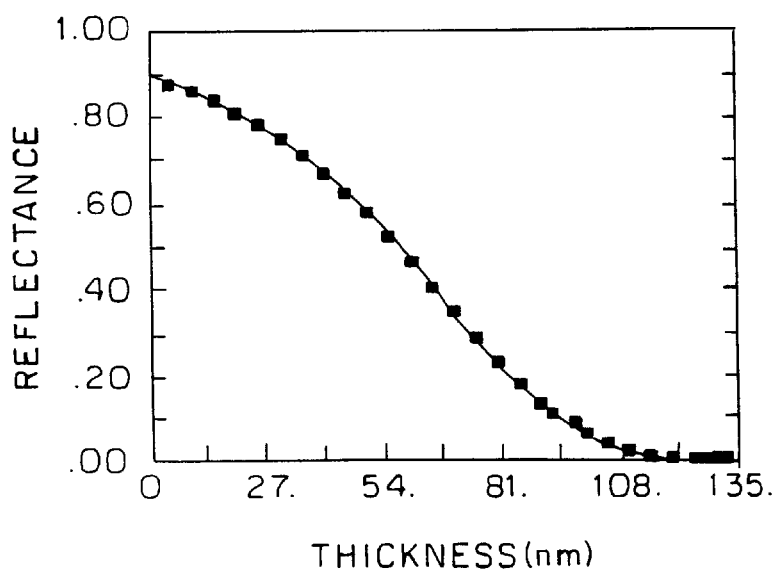
FIG. 7 is a graph comparing reflectance as a function of the thickness of the light absorption when the dielectric layer is not formed.

As shown on the graph of FIG. 7 where the horizontal axis represents the different thicknesses of the light absorption layers tested and the vertical axis represents the reflectance of the light when exposing the light absorption layer to a laser, the reflectance decreased as the thickness of the absorption layer increased. The reflectance reached a low of about 0.01 when the thickness of absorption layer was in the range of about 115 nm to about 135 nm. Thus, as can be seen from this example, even when the dielectric layer is not employed in the integrated circuit, the light absorption layer will absorb substantially all of the light from the laser.

COMPARATIVE EXAMPLE 1

This comparative example illustrates an integrated circuit having no light absorption layer.

An integrated circuit was made by first forming a damascene-patterned aluminum fuse. The fuse had a width of 3 µm, a length of 10 µm and a thickness of 350 nm. A dielectric layer made from the material TEOS was then formed over the fuse. To illustrate the effect of having no light absorption layer formed on the dielectric layer, different thicknesses of the dielectric layer were tested when exposing the dielectric layer to a laser. The wavelength of the laser used was 1300 nm.

Figure 8:
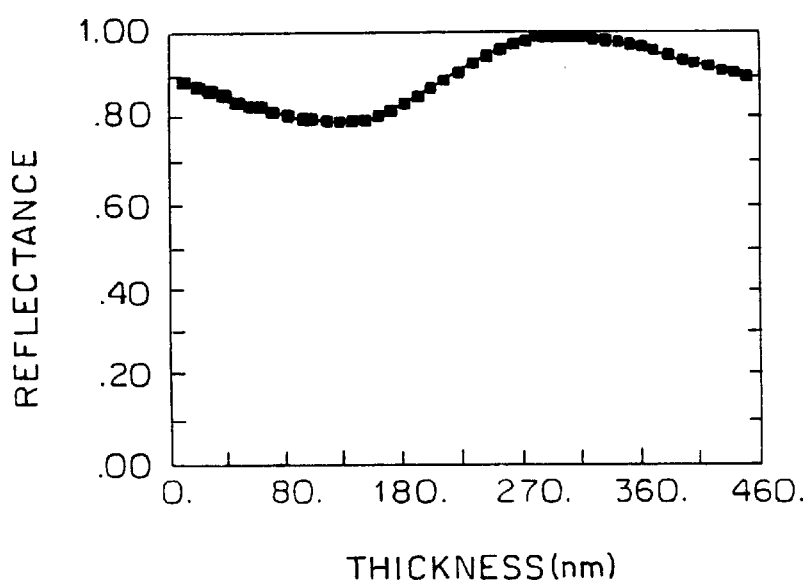
FIG. 8 is a graph comparing reflectance as a function of the thickness of the dielectric layer when the light absorption layer is not formed.

As shown on the graph of FIG. 8 where the horizontal axis represents the different thicknesses of the dielectric layers tested and the vertical axis represents the reflectance of the light when exposing the dielectric layer to a laser, the reflectance remained above 80 percent at all of the different thicknesses of the dielectric layer. Thus, it can be seen that without the light absorption layer the integrated circuit cannot absorb the light during laser deleting which results in incomplete removal of the aluminum fuse.

Although the present invention has been described in preferred forms with a certain degree of particularity, many changes and variations are possible therein and will be apparent to those skilled in the art after reading the foregoing description. It is therefore to be understood that the present invention may be practiced otherwise than as specifically described herein without departing from the spirit and scope thereof.

What is claimed is:

1. A method of making an integrated circuit comprising:
   a) forming at least one interconnect on a substrate, the interconnect forming a fuse;
   b) forming a first dielectric layer over the interconnect and on top of the substrate;
   c) forming a light absorption layer on the first dielectric layer such that the dielectric layer is disposed between the interconnect and the absorption layer; and
   d) exposing a portion of the integrated circuit that includes the interconnect and the first dielectric layer to laser energy, wherein the light absorption layer substantially converts the laser energy into heat to vaporize a portion of the interconnect and the first dielectric layer.

2. The integrated circuit of claim 1 wherein the interconnect is made from material selected from the group consisting of Al, Cu, W, Ti, TiN and alloys thereof.

3. The method of claim 1 wherein the first dielectric layer is made from a material selected from the group consisting of TEOS, silicon oxide and silicon nitride.

4. The method of claim 1 wherein the thickness of the first dielectric layer is from about 25 nm to about 500 nm.

5. The method of claim 1 wherein the light absorption layer made from a material is selected from the group consisting of SiOxNy, diamond like carbon (DLC), amorphous SiC, and silicon nitride.

6. The method of claim 1 wherein the thickness of the light absorption layer is from about 20 nm to about 110 nm.

7. The method of claim 1 further comprising forming a second dielectric layer on the light absorption layer.

8. The method of claim 7 wherein the second dielectric layer is made from a material selected from the group consisting of TEOS, silicon oxide and silicon nitride.

9. The method of claim 7 wherein the thickness of the second dielectric layer is from about 100 nm to about 800 nm.

10. The method of claim 1 wherein the laser energy wavelength is from about 500 to about 2500 nm.

* * * * *